United States Patent [19]
Anzaki et al.

[11] Patent Number: 6,040,056
[45] Date of Patent: *Mar. 21, 2000

[54] TRANSPARENT ELECTRICALLY CONDUCTIVE FILM-ATTACHED SUBSTRATE AND DISPLAY ELEMENT USING IT

[75] Inventors: Toshiaki Anzaki; Etsuo Ogino, both of Osaka, Japan

[73] Assignee: Nippon Sheet Glass Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/864,985

[22] Filed: May 29, 1997

[30] Foreign Application Priority Data

Jun. 7, 1996 [JP] Japan ..................................... 8-145519
Apr. 11, 1997 [JP] Japan ..................................... 9-094061

[51] Int. Cl.$^7$ .................................................. C03C 17/36
[52] U.S. Cl. ........................... 428/432; 428/472; 428/697; 428/701; 428/702
[58] Field of Search ..................................... 428/697, 701, 428/702, 472, 432

[56] References Cited

U.S. PATENT DOCUMENTS 4,859,054  8/1989  Groth et al. .............................. 65/60.2
4,948,677  8/1990  Gillerg ..................................... 428/469
5,028,759  7/1991  Finley ...................................... 219/203

FOREIGN PATENT DOCUMENTS 0 464 789   7/1991  European Pat. Off. .
7325313    12/1995  Japan .

*Primary Examiner*—Archene Turner
*Attorney, Agent, or Firm*—Sughrue, Mion, Zinn Macpeak & Seas, PLLC

[57] ABSTRACT

A transparent electrically conductive film-attached substrate comprising a transparent glass substrate having formed on the surface thereof a transparent electrically conductive film, wherein the transparent electrically conductive film is formed by successively laminating a reflection preventing layer, a silver layer or a metal layer comprising silver as the main component, and a reflection preventing layer, and the reflection preventing layer comprises a composite oxide of zinc and indium. Atomic ratio of zinc and indium of the reflection preventing layer represented by Ad zinc/(zinc+ indium) is from 0.03 to 0.9.

The substrate has both the moisture and heat resistance and the alkali resistance and is suitable for a display element such as a liquid crystal cell.

11 Claims, 1 Drawing Sheet

TRANSPARENT ELECTRICALLY CONDUCTIVE FILM-ATTACHED SUBSTRATE AND DISPLAY ELEMENT USING IT

FILED OF THE INVENTION

The present invention relates to a low-resistance transparent electrically conductive film-attached substrate which is used for thin-type display elements such as a liquid crystal display element, a plasma display element, an organic EL element, etc. More specifically, it relates to a transparent electrically film-attached substrate which is suitably used for a liquid crystal display element having a large area and a high precision, and showing a high-speed response.

BACKGROUND OF THE INVENTION

Hitherto, as a transparent electrically conductive film-attached substrate which is used for a liquid crystal display element, an element obtained by coating the surface of a glass substrate with tin-containing indium oxide (indium oxide doped with a small amount of tin; hereinafter referred to as "ITO") is used. The transparent electrode formed by pattering an ITO transparent electrically conductive film in a definite form is excellent in the transparency to visible light. However, because the transparent electrically conductive film has a large resistivity of an order of $10^{-4}$ $\Omega$cm, there are problems that the surface area must be increased, and for realizing a high precision, lowering of cross talk, and a high-speed response of a display, the thickness of the transparent electrode must be increased.

However, if the thickness of the transparent electrically conductive film is increased, it becomes difficult to form an electrode having a high-precise form with a good yield, and also because a remarkable difference in level is formed in the inside of a liquid crystal display by the transparent electrode, there is a problem that an inferior orientation occurs at a surrounding portion of the different level in the orientation treatment of a liquid crystal by rubbing, etc.

To overcome the problem, a transparent electrode of a three-layer structure comprising a silver thin layer having a low resistivity as an electrically conductive layer, the silver layer being sandwiched with two ITO layers for improving the transparency is disclosed as a transparent electrode for a liquid crystal display in JP-A-63-187399 and JP-A-7-114841 (the term "JP-A" as used herein means an "unexamined published Japanese patent application").

However, the conventional transparent electrically conductive film comprising a laminate of a silver layer having an electrically conductive function and ITO layers having a protective function for the silver layer disclosed in JP-A-63-187399 described above has both a transparency (visible light transmittance) and low resistance characteristics, but has the problems that the ITO layer which is used as a refection preventing film giving the function of protecting the silver layer having a low water resistance from water and moisture has an insufficient adhesive property to the silver layer, and water penetrates into the laminate from poor adhesion portions, resulting in corrosion and deterioration of the silver layer.

SUMMARY OF THE INVENTION

The present invention has been made to overcome the problems described above.

A first embodiment of the present invention is a transparent electrically conductive film-attached substrate for a display element, comprising a transparent substrate having formed on one surface thereof a transparent electrically conductive film, wherein the transparent electrically conductive film is a film formed by successively laminating a reflection preventing layer, a silver layer or a metal layer comprising silver, and a reflection preventing layer, from the substrate side, and each of the reflection preventing layers is a layer comprising a composite oxide of indium and zinc as the main component.

The transparent substrate which can be used in the first embodiment of the present invention includes conventional glass substrates such as a glass of a soda lime silica composition, a borosilicate glass (non-alkali glass), etc., and also plastic substrates and plastic films such as polyethylene terephthalate (PET), polymethyl methacrylate (PMMA), etc., and further includes substrates each prepared by forming a color filter for the purpose of a color display on the surface of the substrate. Furthermore, these substrates are not necessarily flat but may be substrates having curved surface or unevenness.

The first embodiment of the present invention is characterized in that the reflection preventing layer contains a composite oxide of indium and zinc (generally an $In_2O_3$-$ZnO$ oxide; hereinafter referred to as "IZO") . The composite oxide in the present invention includes a compound formed by combining indium, zinc, and oxygen, which is in a so-called thermodynamically metastable amorphous state or a stable crystal state, and a mixture of thermodynamically nonequilibrium indium oxide and zinc oxide. In this case, it is more preferable for protecting the metal layer that the film is in an amorphous state.

The reflection preventing layer of the first embodiment of the present invention is formed by a vacuum film-forming method such as sputtering, a vapor deposition, etc. For example, in the sputtering method, the reflection preventing layer can be formed by sputtering in an atmosphere having an appropriate pressure and containing an appropriate amount of oxygen using a sintered mixture of indium oxide and zinc oxide or a metal containing indium and zinc as a target. In particular, the sputtering method is preferred in the point of easily controlling the composition because the content of zinc in the reflection preventing layer formed is almost the same as the content of zinc in the target used.

The second embodiment of the present invention is the transparent electrically conductive film-attached substrate of the first embodiment, wherein the atomic ratio of indium and zinc in the reflection preventing layer is at least 0.03 as zinc/(indium+zinc). If the atomic ratio is less than 0.03, the adhesive property between the silver layer or the metal layer comprising silver and the reflection preventing layer is decreased, thereby decreasing the moisture and heat resistance of the transparent electrically conductive film. To improve the moisture and heat resistance of the transparent electrically conductive film to a practical level as the substrate for a liquid crystal display element, it is preferred that the ratio is at least 0.03.

The third embodiment of the present invention is the transparent electrically conductive film-attached substrate of the second embodiment, wherein the atomic ratio is at least 0.05.

The fourth embodiment of the present invention is the transparent electrically conductive film-attached substrate of the third embodiment, wherein the atomic ratio is at least 0.1.

By increasing the content of zinc oxide in the reflection preventing layer, the moisture and heat resistance of the transparent electrically conductive film is more improved.

The fifth embodiment of the present invention is the transparent electrically conductive film-attached substrate of the second to fourth embodiments, wherein the atomic ratio is 0.9 or lower.

Where the reflection preventing layer is formed with two components of zinc oxide and indium oxide, if the atomic ratio is higher than 0.9, alkali resistance of the transparent electrically conductive film is decreased, that is, the film is easily dissolved in an aqueous alkali solution or tends to deteriorate or to be damaged in an alkaline atmosphere. Thus, it is preferred that the atomic ratio does not exceed 0.9.

The moisture and heat resistance is the particularly necessary characteristics for ensuring the durability of a liquid crystal display element when the transparent electrically conductive film is used for the liquid crystal display element, and the alkali resistance is the necessary characteristics for ensuring the durability of not causing a deterioration of the transparent electrically conductive film with various alkaline chemical solutions in cleaning steps of assembling a display element of the transparent electrically conductive film and in an electrode pattering step using a photo-lithographic process.

In the present invention, to ensure both the moisture and heat resistance and the alkali resistance in practical levels, the atomic ratio in the reflection preventing layer shown by zinc/(zinc+indium) is preferably from 0.1 to 0.9, and more preferably from 0.2 to 0.85, in the point of further improving the moisture and heat resistance because the stress of the film is decreased with increasing the amorphous tendency of the film of the reflection preventing layer formed, whereby the adhesive property with the silver layer or a metal layer comprising silver as the main component is improved.

Further, from the view point of obtaining the low-resistance transparent electrically conductive film, which is the second object of the present invention, if further considering to lower the electric resistance of the whole laminate of the metal layer and the reflection preventing layers, it is preferred that the atomic ratio is from 0.45 to 0.85.

Moreover, the reflection preventing layer in the present invention may contain a third component such as tin oxide incorporated into the binary system of zinc oxide and indium oxide.

A sixth embodiment of the present invention is the transparent electrically conductive film-attached substrate of the first to fifth embodiments, wherein the silver layer or the metal layer comprising silver as the main component is divided into (n+1) layers (wherein n is an integer of at least 1) by n dividing layer(s) from the layer near the substrate side to the far layer from the substrate, and the dividing layer(s) are constituted by the same materials as the reflection preventing layer. By this construction, the transparent electrically conductive film having further low resistance and further high transmittance can be obtained. As compared with the embodiment where the metal layer is not divided, if a sheet resistance is substantially the same, the transmittance of the transparent electrically conductive film having the divided metal layers can be further increased.

In dividing the metal layer, in order that the vertical visible light transmittance of the entire transparent electrically conductive film-attached substrate of the present invention is 50% or higher, it is preferred that the sum of the thicknesses of the divided metal layers is about 100 nm or less.

The dividing number of the metal layer is determined by the required resistance and transmittance of the transparent electrically conductive film. For example, in a liquid crystal display element having a size that a length of the diagonal line is from about 10 to 17 inches and aiming at a high-precise display of letters and/or figures, the required sheet resistance is a low resistance of about 2 $\Omega/\square$ or less. Hence it is preferred that n is generally 1 or 2.

A seventh embodiment of the present invention is the transparent electrically conductive film-attached substrate of the sixth embodiment, wherein n is 1, that is, the metal layer is divided into two layers.

By dividing the metal layer into two layers, the low-resistance and high-transmittance transparent electrically conductive film having a visible light transmittance of 70% or higher and a sheet resistance of 2 $\Omega/\square$ or lower can be obtained.

An eighth embodiment of the present invention is the transparent electrically conductive film-attached substrate of the first to seventh embodiments, wherein in order to improve the moisture and heat resistance of the transparent electrically conductive film without largely decreasing the visible light transmittance thereof, at least one metal selected from the group consisting of palladium, gold, and copper is incorporated in the silver layer or the metal layer comprising silver as the main component in an amount such that the total amount thereof does not exceed 0.05 (5 atom %) as the atomic ratio based on the total amount of the metals in the metal layer.

To effectively improve the moisture resistance of the metal layer itself, the above-described metal may be incorporated in an amount of at least 0.001 (0.1 atom %) to 1 as the total amount of the metals in the metal layer. Further it is preferred that the metal is incorporated in an amount of at least 0.005 (0.05 atom %).

A ninth embodiment of the present invention is the transparent electrically conductive film-attached substrate of the first to eighth embodiments, wherein the transparent substrate is a glass plate having formed on the surface thereof a color filter for color display.

The color filter which can be used is, for example, an organic resin such as an acrylic resin, a polyester resin, or a polyimide resin, containing an organic dye or an organic pigment. A protective layer of an organic resin for smoothing the surface of the color filter and, if required and necessary, the protective layer further covered with a thin film of an inorganic oxide such as silicon oxide can be formed on a red (R), green (G), or blue (B) color filter.

The transparent electrically conductive substrate of the present invention does not always require heating the substrate in the formation of the transparent electrically conductive film. Therefore, a low-resistance transparent electrically conductive substrate having both the moisture and heat resistance and the alkali resistance can be formed by using the substrate having a color filter containing thermally weak organic resin components. Also, curve characteristics of the transmittance in the wide wavelength range of a visible region can be controlled by appropriately controlling the thicknesses of the reflection preventing layers and the divided metal layers without largely changing the resistance value of the transparent electrically conductive film.

A tenth embodiment of the present invention is a display element using the transparent electrically conductive film-attached substrate of the first to ninth embodiments.

For example, in producing a conventional liquid crystal display element by adhering two transparent electrically conductive film-attached substrates each other with an adhesive at the peripheral portions of them such that the transparent electrically conductive films face each other to form a closed space between the substrates and inclosing a liquid crystal in the closed space, if the transparent electrically conductive film-attached substrate of the present invention is used as at least one of the transparent electrically conductive film-attached substrates, a high-precision and high-image-quality liquid crystal display element is obtained because the electrode has a low resistance.

The reflection preventing layer comprising the composite oxide of indium and zinc, and the silver layer or the metal layer comprising silver as the main component in the present invention can be formed by a conventional vacuum film-forming method such as sputtering, or an ion plating (e.g., a high-density plasma vapor deposition).

DETAILED DESCRIPTION OF THE INVENTION

The present invention is explained in detail below by referring to the accompanying drawings and the examples described below, but the invention is not limited thereto.

Figure 1:
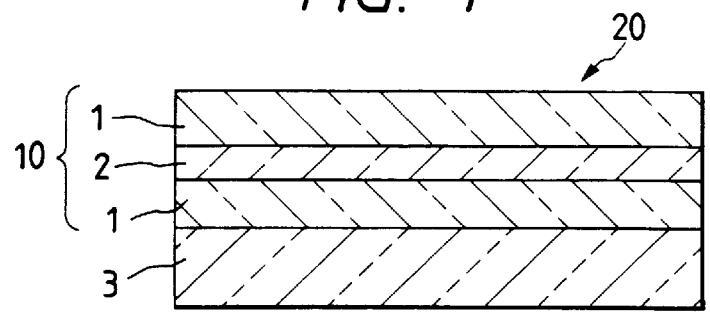
FIG. 1 is an enlarged cross-sectional view showing one example of the transparent electrically conductive film-attached substrate of the present invention.

FIG. 1 is an enlarged cross-sectional view showing one example of the present invention. A transparent electrically conductive film 10 formed by successively laminating a first reflection preventing layer 1, a metal layer 2 comprising silver as the main component, and a second reflection preventing layer 1 in this order is formed on a transparent substrate 3.

Figure 2:
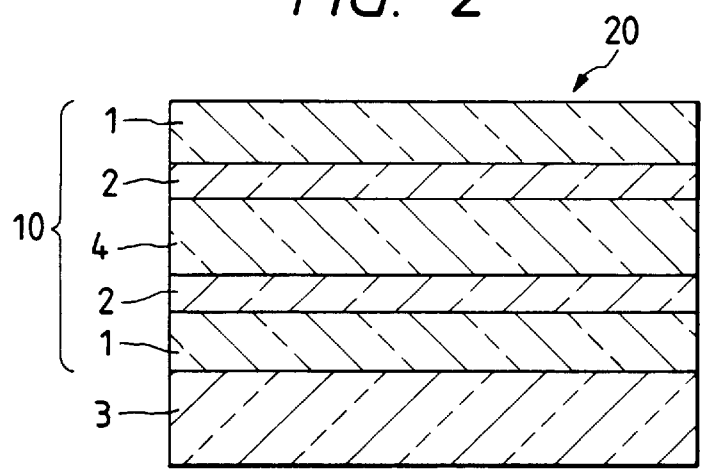
FIG. 2 is an enlarged cross-sectional view showing another example of the transparent electrically conductive film-attached substrate of the present invention.

FIG. 2 is an enlarged cross-sectional view showing another example of the present invention. A transparent electrically conductive film 10 formed by successively laminating a first reflection preventing layer 1, a metal layer 2 comprising silver as the main component, and a second reflection preventing layer in this order is formed on a transparent substrate 3, wherein the metal layer 2 is divided into two layers by a dividing layer 4.

Figure 3:
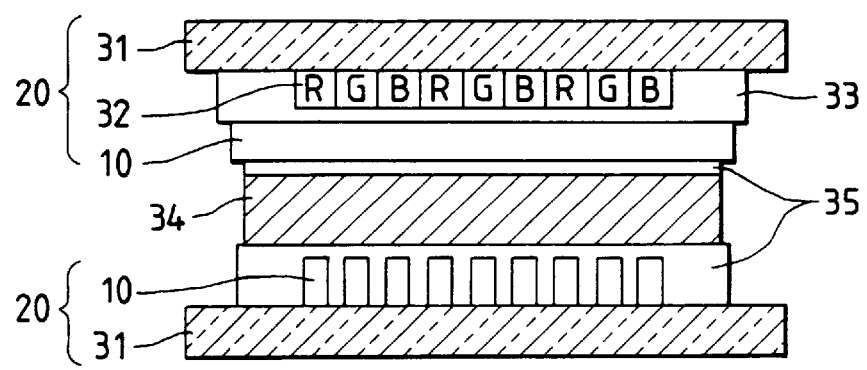
FIG. 3 is an enlarged schematic cross-sectional view showing an example of the liquid crystal display element using the transparent electrically conductive film-attached substrate of the present invention.

FIG. 3 is a schematic enlarged cross-sectional view showing a liquid crystal display element prepared using the transparent electrically conductive film-attached substrate of the present invention. A transparent electrically conductive film-attached substrate 20 of the present invention prepared by forming a color filter 32 of the three primary colors of R (red), G (green), and B (blue) on a glass substrate 31 and forming thereon a protective film 33 comprising an organic resin and a transparent electrically conductive film 10 is used as one substrate. A transparent electrically conductive film-attached substrate 20 prepared by forming a transparent electrically conductive film 10 on a glass substrate 31 is used as another substrate. Those substrates are disposed facing each other, the peripheral portions of them are sealed by an organic resin (not shown) to form a closed space, and a liquid crystal layer 34 is inclosed in the closed space to form a liquid crystal cell. In this embodiment, the transparent electrically conductive film 10 is worked to a desired electrode pattern, and an oriented film 35 is coated thereon.

A display is performed by applying an electric voltage between the transparent electrically conductive films.

The transparent electrically conductive film-attached substrate of the present invention can be used as one or both of the substrates forming the liquid crystal cell.

Where the transparent electrically conductive film is constituted by the three layers wherein the metal layer is not divided, to ensure the transparency to visible light and a low sheet resistance it is preferred that the thickness of the first reflection preventing layer at the substrate side is from 10 to 200 nm, the thickness of the silver layer or the metal layer comprising silver as the main component is from 5 to 100 nm, and the thickness of the second reflection preventing layer is from 10 to 200 nm. It is more preferred as the substrate for a liquid crystal display element that the thickness of each of the first and second reflection preventing layers is from 20 to 80 nm and the thickness of the metal layer is from 7 to 30 nm.

In order to obtain the characteristics of a sheet resistance of from about 2.5 $\Omega/\square$ to 1.5 $\Omega/\square$ and a visible light transmittance of 60% or higher, which are the particularly preferred embodiment of the present invention from the standpoints of the moisture and heat resistance evaluated by exposing to a high-temperature and high-humidity atmosphere for a definite time, the transparency evaluated by the height of the visible light transmittance including the transparent substrate, the electric characteristics evaluated by the low value of the sheet resistance, and the electrode workability evaluated by the easiness of etching and the uniformity on the surface, there is a laminate structure of a glass substrate having a thickness of from 0.7 to 2 mm/an IZO layer having a thickness of from 30 to 70 mm/a metal layer having a thickness of from 5 to 30 mm, having added thereto palladium in an amount of 2 atomic % or lower to silver/an IZO layer having a thickness of from 60 to 120 mm/a metal layer having a thickness of from 5 to 30 nm, having added thereto palladium in an amount of 2 atomic % or lower to silver/an IZO layer having a thickness of from 30 to 70 nm. Also, in order to obtain the characteristics of the sheet resistance of 1.5 $\Omega/\square$ or lower and a visible light transmittance of 60% or higher, there is a laminate structure of a glass substrate/an IZO layer having a thickness of from 30 to 70 nm/a metal layer having a thickness of from 5 to 30 nm, having added thereto palladium in an amount of 2 atomic % or lower to silver/an IZO layer having a thickness of from 60 to 120 nm/a metal layer having a thickness of from 5 to 30 nm, having added thereto palladium in an amount of 2 atomic % to silver having a thickness of from 0.3 to 3.0 mm/an IZO layer having a thickness of from 6 to 120 nm/a metal layer having a thickness of from 5 to 30 nm, having added thereto palladium in an amount of 2 atomic % to silver/an IZO layer having a thickness of from 30 to 70 nm.

EXAMPLE 1

After washing a glass substrate of a soda lime silica composition for a simple matrix liquid crystal display having a length of 400 mm, a width of 300 mm, and a thickness of 0.7 mm, a silicon dioxide layer having a thickness of 30 nm for an alkali passivation was formed on the glass substrate. Using a sintered product of a mixture of indium oxide and zinc oxide s having an atomic ratio of zinc and indium shown by Zn/(In+Zn) of 0.4 as a target for reflection preventing layers and using silver as a target for metal layers, an IZO layer/a metal layer/an IZO layer/a metal layer/an IZO layer having thicknesses of 40 nm, 15 nm, 85 nm, 15 nm, and 40 nm, respectively were successively formed on the glass substrate by a DC sputtering method to obtain a sample 1 of a transparent electrically conductive film-attached glass substrate. The characteristics of the sample 1 are shown in Table 1 below.

Also, by etching together all the layers including the metal layers and the reflection preventing layers of the transparent electrically conductive film of the sample 1 with an etching liquid comprising an aqueous solution containing hydrochloric acid such that a stripe-form transparent electrode having an electrode width of 50 μm and an interval between the electrodes of 15 μm was formed, an electrode pattern working could be carried out.

EXAMPLE 2

After washing a glass substrate of a soda lime silica composition for a simple matrix liquid crystal display having a length of 400 mm, a width of 300 mm, and a thickness of 0.7 mm, a silicon dioxide layer having a thickness of 30 nm for an alkali passivation was formed on the glass substrate. Using a sintered product of a mixture of indium oxide and zinc oxide having an atomic ratio of zinc and indium shown by Zn/(In+Zn) of 0.3 as a target for reflection preventing layers and using a metal having a composition of 99 atomic % silver and 1 atomic % palladium as a target for metal layers, an IZO layer/a metal layer (as a result of the film analysis, the layer composition was almost 99 atomic % silver and 1 atomic % palladium)/an IZO layer/the metal layer/an IZO layer having thicknesses of 42 nm, 14 nm, 85 nm, 16 nm, and 38 nm, respectively were successively formed on the glass substrate by a DC sputtering method to obtain a sample 2 of a transparent electrically conductive film-attached glass substrate. The characteristics of the sample 2 are shown in Table 1 below.

Also, by etching together all the layers of the transparent electrically conductive film of the sample 2 with an aqueous solution containing hydrochloric acid such that a stripe-form transparent electrode having an electrode width of 50 μm and an interval between the electrodes of 15 μm was formed, an electrode pattern working could be carried out.

EXAMPLE 3

After washing a glass substrate of a soda lime silica composition for a simple matrix liquid crystal display having a length of 400 mm, a width of 300 mm, and a thickness of 0.7 mm, a silicon dioxide layer having a thickness of 30 nm for an alkali passivation was formed on the glass substrate. Using a sintered product of a mixture of indium oxide and zinc oxide having an atomic ratio of zinc and indium shown by Zn/(In+Zn) of 0.5 as a target for reflection preventing layers and using a metal having a composition of 99 atomic % silver and 1 atomic % palladium as a target for metal layers, an IZO layer/a metal layer (as a result of the film analysis, the layer composition was almost 99 atomic % silver and 1 atomic % palladium)/an IZO layer/the metal layer/an IZO layer having thicknesses of 42 nm, 16 nm, 85 nm, 14 nm, and 38 nm, respectively were successively formed on the glass substrate by a DC sputtering method to obtain a sample 3 of a transparent electrically conductive film-attached glass substrate. The characteristics of the sample 3 are shown in Table 1 below.

Also, by etching together all the layers of the transparent electrically conductive film of the sample 3 with an aqueous solution containing hydrochloric acid such that a stripe-form transparent electrode having an electrode width of 50 μm and an interval between the electrodes of 15 μm was formed, an electrode pattern working could be carried out. Thereafter, by applying a heat treatment at 230° C. for 30 minutes in the air, the resistance of the film could be improved to about 20%.

EXAMPLE 4

After washing a glass substrate of a soda lime silica composition for a simple matrix liquid crystal display having a length of 420 mm, a width of 300 mm, and a thickness of 0.7 mm, a silicon dioxide layer having a thickness of 30 nm for an alkali passivation was formed on the glass substrate. Using a sintered product of a mixture of indium oxide and zinc oxide having an atomic ratio of zinc and indium shown by Zn/(In+Zn) of 0.1 as a target for reflection preventing layers and using a metal having a composition of 99 atomic % silver and 1 atomic % palladium as a target for metal layers, an IZO layer/a metal layer (as a result of the film analysis, the layer composition was almost 99 atomic % silver and 1 atomic % palladium)/an IZO layer/the metal layer/an IZO layer having thicknesses of 45 nm, 18 nm, 85 nm, 18 nm, and 43 nm, respectively were successively formed on the glass substrate by a DC sputtering method to obtain a sample 4 of a transparent electrically conductive film-attached glass substrate. The characteristics of the sample 4 are shown in Table 1 below.

Also, by etching together all the layers of the transparent electrically conductive film of the sample 4 with an aqueous solution containing hydrochloric acid such that a stripe-form transparent electrode having an electrode width of 50 μm and an interval between the electrodes of 15 μm was formed, an electrode pattern working could be carried out.

EXAMPLE 5

After washing a glass substrate of a soda lime silica composition for a simple matrix liquid crystal display having a length of 420 mm, a width of 300 mm, and a thickness of 0.7 mm, a silicon dioxide layer having a thickness of 30 nm for an alkali passivation was formed on the glass substrate. Using a sintered product of a mixture of indium oxide and zinc oxide having an atomic ratio of zinc and indium shown by Zn/(In+Zn) of 0.05 as a target for reflection preventing layers and using a metal having a composition of 99 atomic % silver and 1 atomic % palladium as a target for metal layers, an IZO layer/a metal layer (as a result of the film analysis, the layer composition was almost 99 atomic % silver and 1 atomic % palladium)/an IZO layer/the metal layer/an IZO layer having thicknesses of 46 nm, 18 nm, 86 nm, 18 nm, and 44 nm, respectively were successively formed on the glass substrate by a DC sputtering method to obtain a sample 5 of a transparent electrically conductive film-attached glass substrate. The characteristics of the sample 5 are shown in Table 1 below.

Also, by etching together all the layers of the transparent electrically conductive film of the sample 5 with an aqueous solution containing hydrochloric acid such that a stripe-form transparent electrode having an electrode width of 50 μm and an interval between the electrodes of 15 μm was formed, an electrode pattern working could be carried out.

EXAMPLE 6

After washing a glass substrate of a soda lime silica composition for a simple matrix liquid crystal display having a length of 420 mm, a width of 300 mm, and a thickness of 0.7 mm, a silicon dioxide layer having a thickness of 30 nm for an alkali passivation was formed on the glass substrate. Using a sintered product of a mixture of indium oxide and zinc oxide having an atomic ratio of zinc and indium shown by Zn/(In+Zn) of 0.03 as a target for reflection preventing layers and using a metal having a composition of 99 atomic % silver and 1 atomic % palladium as a target for metal layers, an IZO layer/a metal layer (as a result of the film analysis, the layer composition was almost 99 atomic % silver and 1 atomic % palladium)/an IZO layer/the metal layer/an IZO layer having thicknesses of 45 nm, 18 nm, 85 nm, 18 nm, and 43 nm, respectively were successively formed on the glass substrate heated to 200° C. in a film-forming apparatus by a DC sputtering method to obtain a sample 6 of a transparent electrically conductive film-attached glass substrate. The characteristics of the sample 6 are shown in Table 1 below.

Also, by etching together all the layers of the transparent electrically conductive film of the sample 6 with an aqueous solution containing hydrochloric acid such that a stripe-form transparent electrode having an electrode width of 50 μm and an interval between the electrodes of 15 μm was formed, an electrode pattern working could be carried out.

EXAMPLE 7

The same procedure as in Example 6 was followed except that the glass substrate was not heated during the film formation, to obtain a sample 7. The electrode pattern working characteristics were almost the same as in the sample 6. The characteristics of the sample 7 are shown in Table 1 below.

EXAMPLE 8

The same procedure as in Example 6 was followed except that the substrate was not heated during the film formation and the laminate had a three layer structure, to obtain a sample 8. The layer structure and the characteristics of the sample 8 are shown in Table 1. Also, the electrode pattern working characteristics of the sample 8 was almost the same as in the sample 6.

COMPARATIVE EXAMPLE 1

After washing a glass substrate of a soda lime silica composition for a simple matrix liquid crystal display having a length of 400 mm, a width of 300 mm, and a thickness of 0.7 mm, a silicon dioxide layer having a thickness of 30 nm for an alkali passivation was formed on the glass substrate. Using a target of indium oxide and a target of silver, an $In_2O_3$ layer/a silver layer/an $In_2O_3$ layer/a silver layer/an $In_2O_3$ layer having thicknesses of 41 nm, 15 nm, 81 nm, 15 nm, and 39 nm were successively formed on the glass substrate by a DC sputtering method to obtain a comparative sample 1 of a transparent electrically conductive film-attached glass. The results obtained by testing the characteristics of the comparative sample 1 in the same methods as in Table 1 are shown in Table 2 below.

COMPARATIVE EXAMPLE 2

After washing a glass substrate of a soda lime silica composition for a simple matrix liquid crystal display having a length of 400 mm, a width of 300 mm, and a thickness of 0.7 mm, a silicon dioxide layer having a thickness of 30 nm for an alkali passivation was formed on the glass substrate. Using a target of zinc oxide and a target of silver as sputtering targets, a ZnO layer/the metal layer/a ZnO layer/the metal layer/a ZnO layer having thicknesses of 41 nm, 15 nm, 81 nm, 15 nm, and 39 nm were successively formed on the glass substrate by a DC sputtering method to obtain a comparative sample 2 of a transparent electrically conductive film-attached glass. The results obtained by testing the characteristics of the comparative sample 2 in the same methods as in Table 1 are shown in Table 2 below.

COMPARATIVE EXAMPLE 3

After washing a glass substrate of a soda lime silica composition for a simple matrix liquid crystal display having a length of 400 mm, a width of 300 mm, and a thickness of 0.7 mm, a silicon dioxide layer having a thickness of 30 nm for an alkali passivation was formed on the glass substrate. Using indium oxide containing 10% by weight of tin oxide and a metal containing 99 atomic % silver and 1 atomic % palladium as sputtering targets, an ITO layer/a metal layer (by the analysis of the layer, the layer was composed of almost 99 atomic % palladium and 1 atomic % silver)/an ITO layer/the metal layer/an ITO layer having thicknesses of 41 nm, 15 nm, 81 nm, 15 nm, and 39 nm were successively formed on the glass substrate by a DC sputtering method to obtain a comparative sample 3 of a transparent electrically conductive film-attached glass. The results obtained by testing the characteristics of the comparative sample 3 in the same methods as in Table 1 are shown in Table 2 below.

Also, by etching together all the layers of the transparent electrically conductive film of the comparative sample 3 with an aqueous solution containing hydrochloric acid such that a stripe-form transparent electrode having an electrode width of 50 μm and an interval between the electrodes of 15 μm was formed, an electrode pattern working could be carried out.

COMPARATIVE EXAMPLE 4

After washing a glass substrate of a soda lime silica composition for a simple matrix liquid crystal display having a length of 400 mm, a width of 300 mm, and a thickness of 0.7 mm, a silicon dioxide layer having a thickness of 30 nm for an alkali passivation was formed on the glass substrate. Using indium oxide containing 10% by weight tin oxide and a metal containing 99 atomic % silver and 1 atomic % palladium as the sputtering targets, an ITO layer/a metal layer (as a result of the film analysis, the layer composition was almost 99 atomic % silver and 1 atomic % palladium)/an ITO layer/the metal layer/an ITO layer having thicknesses of 41 nm, 15 nm, 81 nm, 15 nm, and 39 nm, respectively were successively formed on the glass substrate by a DC sputtering method to obtain a comparative sample 4 of a transparent electrically conductive film-attached glass substrate. The results of testing the characteristics of the comparative sample 4 in the same methods as in Table 1 are shown in Table 2 below.

Also, by etching together all the layers of the transparent electrically conductive film of the comparative sample 4 with an aqueous solution containing hydrochloric acid such that a stripe-form transparent electrode having an electrode width of 50 μm and an interval between the electrodes of 15 μm was formed, an electrode pattern working could be carried out. Thereafter, by applying a heat treatment at 230° C. for 30 minutes in the air, the resistance of the film could be improved to about 20%.

From Table 1 and Table 2 shown below, it can be seen that the samples of the present invention obtained in Examples 1 to 8 had excellent characteristics in both characteristics of the moisture and heat resistance and the alkali resistance.

The moisture and heat characteristics are the necessary characteristics for obtaining the high reliability of each sample where being used as a liquid crystal display element, and the alkali resistance is the necessary characteristics for obtaining a durability to cleaning chemicals for the transparent electrically conductive film-attached substrate and an alkaline aqueous solution which is used for the electrode pattering work of the transparent electrically conductive film.

It can be seen that the samples obtained in the examples of the present invention have both the moisture and heat resistance and the alkali resistance as compared with the samples of the comparative examples as shown in the Tables below and also because the samples of the present invention can make a fine electrode pattern working, the samples of the present invention are transparent electrically conductive film-attached substrates having a very excellent practicability.

TABLE 1

(Example)

| Sample No. | Laminate Structure of Film<br>Film Thickness (nm)<br>Zn-Content*1 | (A) ($\Omega/\square$) | (B) (%) | (C) | (D) |
|---|---|---|---|---|---|
| 1 | IZO/Ag/IZO/Ag/IZO<br>40/15/85/15/40<br>Zn/(In + Zn) = 30% | 1.8 | 80 | good | ○ |
| 2 | IZO/Ag—Pd/IZO/Ag—Pd/IZO<br>42/14/85/16/38<br>Zn/(In + Zn) = 30% | 1.7 | 79 | good | ○ |
| 3 | IZO/Ag—Pd/IZO/Ag—Pd/IZO<br>42/16/85/14/38<br>heat-treatment<br>Zn/(In + Zn) = 50% | 1.9 | 80 | good | ○ |
| 4 | IZO/Ag—Pd/IZO/Ag—Pd/IZO<br>45/18/85/18/43<br>Zn/(In + Zn) = 10% | 1.6 | 78 | good | ○ |
| 5 | IZO/Ag—Pd/IZO/Ag—Pd/IZO<br>46/18/86/18/44<br>Zn/(In + Zn) = 5% | 1.6 | 78 | good | ○ |
| 6 | IZO/Ag—Pd/IZO/Ag—Pd/IZO<br>45/18/85/18/43 (E)<br>Zn/(In + Zn) = 3% | 1.7 | 78 | good | ○ |
| 7 | IZO/Ag—Pd/IZO/Ag—Pd/IZO<br>45/18/85/18/43<br>Zn/(In + Zn) = 3% | 1.8 | 79 | good | ○ |
| 8 | IZO/Ag—Pd/IZO<br>45/15/45<br>Zn/(In + Zn) = 3% | 2.8 | 85 | good | ○ |

*1: Zinc content in reflection preventing layer.
(A): Sheet resistance
(B): Transmittance
(C): Moisture and heat resistance
(D): Alkali resistance
(E): Film formation at raised temperature
1): In the laminate structure, the left side is the substrate side.
2): The value of the 550 nm transmittance including the soda lime glass substrate.
3): The exposure at 90% RH, at 60° C., for 24 hours.
4): After immersing in an aqueous solution of 5 wt. % NaOH at 40° C. for 5 minutes, visually observed.
5): IZO is the composite oxide of indium and zinc

TABLE 2

(Comparative Example)

| Sample No. | Laminate structure of film<br>Film thickness (nm)<br>Zn Content *1 | (A) ($\Omega/\square$) | (B) (%) | (C) | (D) |
|---|---|---|---|---|---|
| 1 | $In_2O_3$/Ag/$In_2O_3$/Ag/$In_2O_3$<br>41/15/81/15/39<br>Zn/(In + Zn) = 0% | 1.9 | 76 | (a) | ○ |
| 2 | ZnO/Ag/ZnO/Ag/ZnO<br>41/15/81/15/39<br>Zn/(In + Zn) = 100% | 1.8 | 79 | good | x |
| 3 | ITO/Ag/ITO/Ag/ITO<br>41/15/81/15/39<br>Zn/(In + Zn) = 0% | 1.9 | 80 | (a) | ○ |
| 4 | ITO/Ag/ITO/Ag/ITO<br>41/15/81/15/39<br>Heat treatment<br>Zn/(In + Zn) = 0% | 1.4 | 80 | (a) | ○ |

*1, (A), (B), (C), and (D) are the same as defined in Table 1.
Also, 1), 2), 3), 4), and 5) are the same as defined in Table 1.

As described above, the present invention has the following effects.

In the invention of the first embodiment of the present invention, a composite oxide of indium and zinc is used as the reflection preventing layers for protecting the silver layer or the metal layer comprising silver as the main component of the transparent electrically conductive film-attached substrate and also for improving the transmittance as the electrically conductive film-attached substrate. Therefore, a low-resistance transparent electrically conductive film-attached substrate having the moisture and heat resistance, the alkali resistance, and a good electrode pattern workability, and further having a high visible light transmittance is obtained.

In the invention of the second embodiment of the present invention, the lower limit of the zinc content in the reflection preventing layers is determined, whereby the better moisture and heat resistance of the transparent electrically conductive film is ensured.

The inventions of the third and fourth embodiments of the present invention are preferred embodiments, and the moisture and heat resistance is further improved.

In the invention of the fifth embodiment of the present invention, the upper limit of the Zn content in the reflection preventing layers is determined, whereby the durability to alkaline chemicals which are used in the production step of liquid crystal display elements is ensured.

In the invention of the sixth embodiment of the present invention, the silver layer or a metal layer comprising silver as the main component is divided by dividing layer(s) having the same composition as in the reflection preventing layer. Therefore, a low-resistant transparent electrically conductive film can be obtained without decreasing the transmittance.

In the invention of the seventh embodiment of the present invention, the number of the dividing layer is minimum, whereby the low-resistance and high-transmittance substrate can be economically obtained.

In the invention of the eighth embodiment of the present invention, at least one of palladium, gold, and copper is incorporated in the silver layer, whereby the moisture resistance of the metal layer itself is improved.

In the invention of the ninth embodiment of the present invention, heating of the substrate is unnecessary in forming the transparent electrically conductive film, whereby the low-resistance substrate having both the moisture and heat resistance and the alkali resistance can be used as a substrate having a color filter containing thermally weak organic resin components. Also, the transmittance curve in the wide wavelength range of a visible region can be changed by appropriately controlling the thicknesses of the reflection preventing layers and the dividing layer(s), without largely changing the resistance and the visible light transmittance of the transparent electrically conductive film. The control of the color balance, which is not obtained by a single ITO layer in conventional techniques, can be controlled without largely changing the sheet resistance of the transparent electrically conductive film, and the transparent electrically conductive film-attached substrate can be suitably used for a color display. Accordingly, the transparent electrically conductive film-attached substrate of the present invention is suitable to not only a multi color display but also full color display required a large-size precise display and fine color tones.

While the invention has been described in detail and with reference to specific embodiments thereof, it will be apparent to one skilled in the art that various changes and modifications can be made therein without departing from the spirit and scope thereof.

What is claimed is:

1. A transparent electrically conductive film-attached substrate comprising a transparent substrate having formed on one of surface thereof a five-layer transparent electrically conductive film having a sheet resistance of about 2.5 Ω/□ or less, wherein said transparent electrically conductive film is formed by successively laminating onto said substrate a first reflection preventing layer having a thickness of 30 to 70 nm, a first metal layer comprising silver as the main component having a thickness of 5 to 30 nm, a dividing layer having a thickness of 60 to 120 nm, a second metal layer comprising silver as the main component having a thickness of 5 to 30 nm, and a second reflection preventing layer having a thickness of 30 to 70 nm, from said transparent substrate side, and wherein each of said reflection preventing layers and said dividing layer comprises a composite oxide of indium and zinc as the main component.

2. The transparent electrically conductive substrate as claimed in claim 1, wherein an atomic ratio of zinc and indium in the reflection preventing layer represented by zinc/(indium+zinc) is at least 0.03.

3. The transparent electrically conductive substrate as claimed in claim 2, wherein the atomic ratio of zinc and indium in the reflection preventing layer represented by zinc/(indium+zinc) is at least 0.05.

4. The transparent electrically conductive substrate as claimed in claim 3, wherein the atomic ratio of zinc and indium in the reflection preventing layer represented by zinc/(indium+zinc) is at least 0.1.

5. The transparent electrically conductive substrate as claimed in claim 2, wherein the atomic ratio of zinc and indium in the reflection preventing layer represented by zinc/(indium+zinc) is 0.9 or lower.

6. The transparent electrically conductive substrate as claimed in claim 1, wherein the silver layer or the metal layer comprising silver as the main component further contains at least one metal selected from the group consisting of palladium, gold, and copper in an amount such that an atomic ratio thereof based on the total amount of the metals in the layer does not exceed 0.05.

7. The transparent electrically conductive substrate as claimed in claim 6, wherein said first and second metal layers comprise palladium.

8. The transparent electrically conductive substrate as claimed in claim 1, wherein the transparent substrate is a glass plate having formed thereon a color filter.

9. A display element using the transparent electrically conductive film-attached substrate as claimed in claim 1.

10. The transparent electrically conductive substrate as claimed in claim 1, wherein said first and second metal layers are silver layers.

11. The transparent electrically conductive substrate as claimed in claim 1, wherein said electrically conductive film has a sheet resistance from about 2.5 Ω/□ to 1.5 Ω/□.

* * * * *